United States Patent [19]
Oshima et al.

[11] Patent Number: 5,241,912
[45] Date of Patent: Sep. 7, 1993

[54] TRANSFERRING APPARATUS HAVING A MAGNETICALLY FLOATING CARRIER MEMBER WITH THE FLOATING MAGNETS ACTING THROUGH A REDUCED THICKNESS PORTION OF A WALL

[75] Inventors: Jinichiro Oshima; Yoshimasa Oda, both of Narashino, Japan

[73] Assignee: Seiko Seiki Kabushiki Kaisha, Japan

[21] Appl. No.: 809,312

[22] Filed: Dec. 18, 1991

[30] Foreign Application Priority Data

Dec. 28, 1990 [JP] Japan .................. 2-409247

[51] Int. Cl.$^5$ .................. B60L 13/04; B60L 13/06
[52] U.S. Cl. .................. 104/282; 104/284; 104/138.1
[58] Field of Search .............. 104/281, 282, 284, 118, 104/138.1; 105/141

[56] References Cited

U.S. PATENT DOCUMENTS

| | | | |
|---|---|---|---|
| 4,392,435 | 7/1983 | Moody et al. | 104/281 X |
| 4,540,326 | 9/1985 | Southworth et al. | 104/138.1 X |
| 4,624,617 | 11/1986 | Belna | 104/282 X |
| 4,664,578 | 5/1987 | Kakehi | 104/290 X |
| 4,766,993 | 8/1988 | Kita et al. | 104/281 |
| 4,998,859 | 3/1991 | Oshima et al. | 414/680 |

FOREIGN PATENT DOCUMENTS

| | | | |
|---|---|---|---|
| 2530216 | 2/1977 | Fed. Rep. of Germany | 104/282 |
| 92205 | 4/1988 | Japan | 104/281 |
| 157605 | 6/1988 | Japan | 104/281 |
| 178704 | 7/1988 | Japan | 104/281 |

Primary Examiner—Robert J. Oberleitner
Assistant Examiner—S. Joseph Morano
Attorney, Agent, or Firm—Bruce L. Adams; Van C. Wilks

[57] ABSTRACT

The transferring device is provided with a cylindrical partition wall formed with reduced thickness portions 14. A floating carrier 3 is disposed around the cylindrical partition wall and is provided with target pieces 15. The reduced thickness portion 14 is formed by recessing the outer peripheral face 1a of the partition wall 1 along the lengthwise direction thereof. Electromagnets 10, 11 are mounted on an actuating block 4 within the tubular partition wall 1 in opposed relation to the reduced thickness portions 14. The target piece 15 are also opposed in alignment with the reduced thickness portions 14. The partition wall 1 has a sufficient thickness other than the reduced thickness portions 14 so as to ensure physical strength of the partition wall 1. Magnetic force is applied from the electromagnets 10, 11 to the target pieces 15 through the reduced thickness partition 14, thereby supporting the floating carrier 3 with a reduced amount of an exciting current flowing through the electromagnets 10, 11.

20 Claims, 2 Drawing Sheets

TRANSFERRING APPARATUS HAVING A MAGNETICALLY FLOATING CARRIER MEMBER WITH THE FLOATING MAGNETS ACTING THROUGH A REDUCED THICKNESS PORTION OF A WALL

BACKGROUND OF INVENTION

The present invention relates to an apparatus for transferring a wafer etc. in a vacuum chamber.

Conventionally, this kind of the transferring apparatus is provided with a tubular partition wall having a rectangular section or a circular section within a vacuum camber. The inside of the partition wall is held under the atmospheric state. On the other hand, the outside of the partition wall is exposed to the vacuum state in the vacumm chamber.

A floating carrier having a feeding rod is arranged around the outer periphery of the partition wall. On the other hand, an actuating block is disposed inside the partition wall. The actuating block is provided with magnetic bearings around its outer periphery, and is constructed to undergo a reciprocal displacement between the opposite ends of the tubular partition wall. The magnetic bearings are comprised of a plurality of electromagnets and a plurality of sensors. Each sensor operates to detect a floating position or a gap of the floating carrier, while each electromagnet is activated according to detected values outputted from the sensors. By such an operation, magnetic force is applied to the floating carrier through the partition wall to support the floating carrier.

In operation of the above described transferring apparatus, after the carrier is provisionally floated and supported by the magnetic bearings, the actuating block is operated to undergo reciprocal displacement. The floating carrier is displaced reciprocally according to the movement of the actuating block so that the feeding rod on the floating carrier effects transfer of the wafers.

However, in the above noted transferring apparatus of the prior art, the tubular partition wall has a rectangular section, hence the partition wall may be deformed due to pressure difference inside and outside the partition wall. Such deformation may be prevented if the thickness of the partition wall is increased. However, in such a case, the increased thickness weakens the magnetic force applied from the electromagnets to the floating carrier through the partition wall. Therefore, it would be necessary to increase an exciting current of the electromagnets, thereby causing drawbacks such as increase in power consumption of the transferring apparatus or device and heat generation from the electromagnets of the device.

On the other hand, another type of the conventional transferring device utilizes a tubular partition wall of a circular section instead of the sectionally rectangular partition wall. The circular partition wall may not develop deformation even if the thickness of the partition wall is decreased. Therefore, the circular partition wall can facilitate reduction in power consumption of the device and can suppress heat generation. However, it is generally difficult to produce a tubular partition wall of the circular section having a small thickness, and a thin tubular partition wall has disadvantouslly a poor mechanical or structural strength.

SUMMARY OF THE INVENTION

An object of the present invention is to improve the mechanical strength of a partition wall utilized in the transferring device, while avoiding heat generation of the device and facilitating reduction in the power consumption. In order to achieve the aforesaid object, the present invention is applied to a transferring device having a tubular partition wall of a circular section, a floating carrier having a feeding rod and being arranged around the outer periphery of the partition wall, an actuating block disposed inside the partition wall movably between the opposite ends of the tubular partition wall in the bidirectional directions, and magnetic bearings provided integrally on an outer face of the actuating block and comprised of sensors and electromagnets for floating and supporting the carrier. The invention features that the partition wall is formed with a reduced thickness portion in opposed relation to the electromagnets and sensors of the magnetic bearings and that the floating carrier is provided with targets in opposed relation to the reduced thickness portion of the partition wall.

According to the invention, the magnetic force of the electromagnets is applied to the targets of the floating carrier through the reduced thickness portion of the portion wall, thereby supporting the floating carrier with a reduced amount of exciting current. The partition wall has a sufficient thickness other than the reduced thickness portions so as to improve the physical strength of the partition wall.

DETAILED DESCRIPTION OF THE PREFERRED EMBODIMENT

Figure 1:
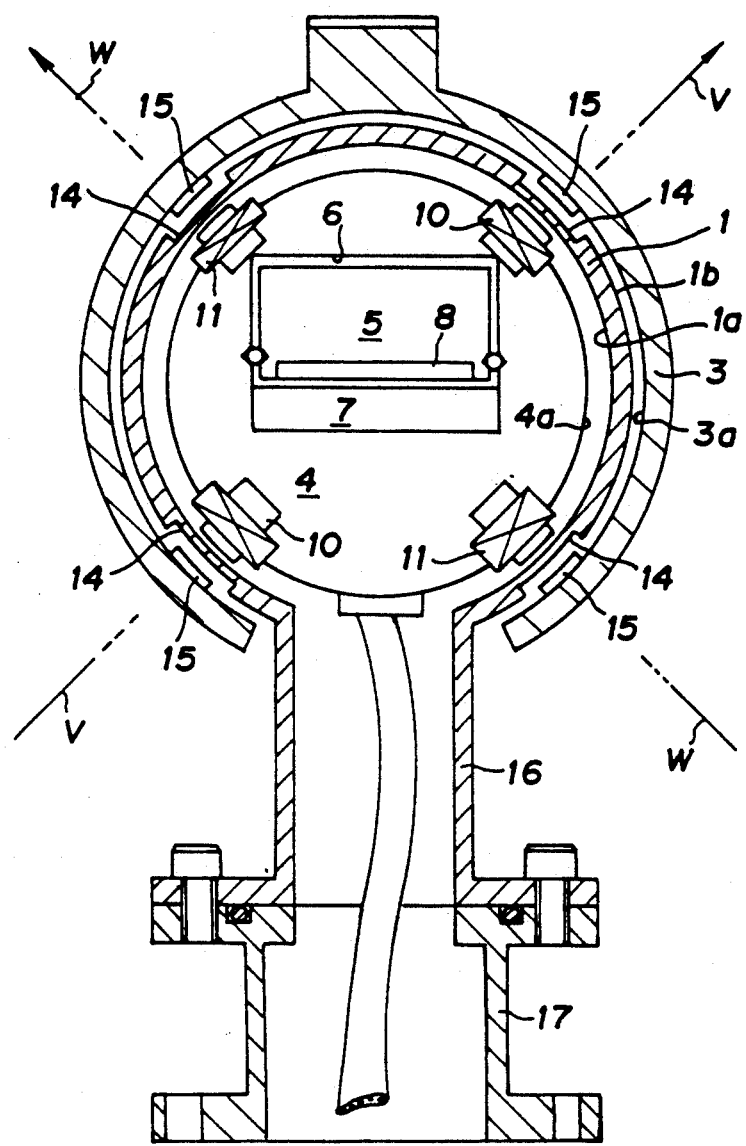
FIG. 1 is a sectional view showing an essential part of the inventive transferring device.

Hereinafter, one embodiment of the inventive transferring device will be described in detail with reference to FIGS. 1 and 2. As shown in FIG. 1, the transferring device has a tubular member in the form of a partition wall 1 disposed within a vacuum chamber (not shown). The inside of the partition wall 1 bordered by an inner periphery 1a is held under the atmospheric state. A floating carrier member 3 having a feeding rod 2 (see FIG. 2) is disposed around and partly encircles an outer periphery 1b of the partition wall. The floating carrier 3 is composed of a ring member having a size slightly greater than the outer diameter of the cylindrical partition wall 1. The inner periphery 3a of the ring-like floating carrier 3 is opposed to the outer periphery 1b of the tubular partition wall 1.

On the other hand, an actuating block 4 is mounted inside the partition wall 1. The actuating block 4 is shaped in a cylinder slightly smaller than the inner diameter of the partition wall 1. The outer face 4a of the cylindrical actuating block 4 is opposed to the inner periphery 1a of the partition wall 1. The actuating block 4 is movably engaged with a guide rail 5 and is movable therealong in the bidirections. The guide rail 5 is inserted through an opening 6 of the actuating block 4 and is extended between the opposite ends of the partition wall 1 (see FIG. 2). Namely, the actuating block 4 is constructed to undergo reciprocal movement between the opposite ends of the tubular partition wall 1 along the guide rail 5. Further, a linear motor coil 7 is disposed in the opening 6 of the actuating block 4, and a stationary motor conductor 8 is disposed along the guide rail 5 in opposed relation to the linear motor coil 7. The linear motor coil 7 and stationary motor conductor 8 constitute together a linear motor cooperative to effect displacement of the actuating block 4 along the guide rail 5.

Figure 2:
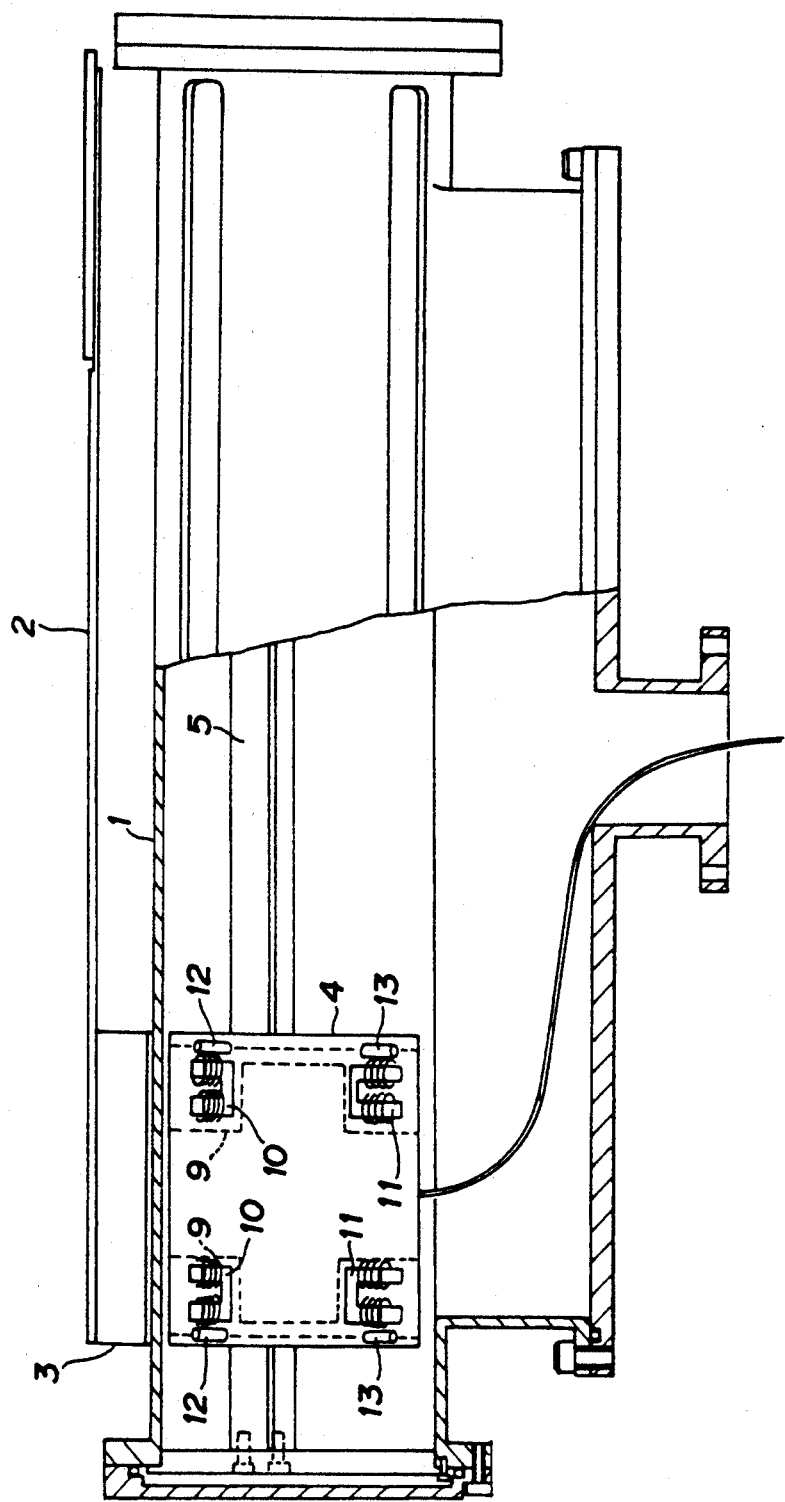
FIG. 2 is a partially broken side view of the inventive transferring device.

A pair of magnetic bearing units 9 are mounted on the actuating block 4 (see FIG. 2). One magnetic bearing unit 9 is comprised of a pair of electromagnets 10 arranged on the axis V, and the other bearing unit 9 is comprised of another pair of electromagnets 11 disposed on the axis W. As shown in FIG. 1, the axes V and W are orthogonal to each other. The respective units 9 are further provided with sensors 12 and 13. The electromagnets 10, 11 and the sensors 12, 13 are arranged integrally on the outer periphery 4a of the actuating block 4 in opposed relation to the inner periphery 1a of the partition wall 1. The one sensor 12 is positioned adjacently to the axis V so as to detect a floating position of the carrier 3 with respect to the axis V, while the other sensor 13 is positioned adjacently to the axis W so as to detect a floating position of the carrier 3 with respect to the axis W. By such construction, the pair of magnetic bearing units 9 operate such that the electromagnets 10, 11 are excited according to the detected values outputted from the respective sensors 12, 13 to generate magnetic forces effective to magnetically support and float the floating carrier 3.

The partition wall 1 is formed with four reduced thickness portions 14. Each reduced thickness portion 14 is formed by recessing the outer peripheral face 1b of the partition wall 1 in the lengthwise direction thereof (see FIG. 2). The electromagnets 10, 11 and sensors 12, 13 are opposed in registration with the recessed portions 14. On the other hand, the floating carrier 3 is provided on its inner periphery 3a with four pieces of targets 15. Each target piece 15 is composed of magnetic material, and is opposed in alignment with a corresponding recessed portion 14. The floating carrier member 3 may be composed of magnetic material, and therefore, the targets 15 may be formed integrally with the carrier member 3. However, in order to reduce weight, generally the floating carrier member 3 is composed of nonmagnetic material such as aluminum alloy, and therefore the target piece 15 is separately formed of magnetic material.

The tubular partition wall 1 is connected through a support 16 to a rotary shaft 17, and is angularly displaced through 360° by rotation of the rotary shaft 17.

Next, a description is given of the operation of the transferring device constructed as described above, in conjunction with the drawings. In this transferring device, the pair of magnetic bearing units 9 are provisionally operated to magnetically support the floating carrier 3. In this operation, the respective electromagnets 10, 11 of the magnetic bearing units 9 generate magnetic force which coacts with the respective magnetic targets 15 through the interposed recess portions 14. Then, the actuating block 4 is operated to undergo reciprocal displacement while the floating carrier 3 is supported magnetically, so that the floating carrier 3 is accordingly displaced reciprocally in response to the movement of the actuating block 4. Consequently, the feeding rod 2 of the floating carrier 3 carries out transportation of a wafer. In addition, the rotary shaft 17 can be rotated to angularly displace the tubular partition wall 1 so as to change operating direction of the feeding rod 2 through 360°. In this embodiment, the electromagnets and sensors are opposed in alignment with the recessed portions formed on the partition wall, while the targets are provided on the floating carrier in opposed relation to the recessed portions. The partition wall has a sufficient thickness other than the recessed portions, thereby facilitating machining of the partition wall and improving the mechanical strength of the partition wall. Moreover, the magnetic force of the electromagnets is applied to the magnetic targets through the recessed portions or reduced thickness portions, thereby reducing the amount of exciting current needed to magnetically support the floating carrier, preventing heat generation from the electromagnets, and facilitating reduction in power consumption.

As described above, according to the invention, the transferring device is provided with a tubular partition wall formed selectively with recessed portions in opposed relation to the electromagnets and the sensors of the magnetic bearings. On the other hand, the floating carrier member is provided with target pieces in opposed relation to the recessed portions. Therefore, the partition wall has a greater thickness other than the recessed portions, thereby facilitating machining of the partition wall member and increasing physical strength of the partition wall. Further, the magnetic force of the electromagnets is applied to the targets through the recessed portions to thereby reduce the amount of the exciting current to support the floating carrier, thereby preventing heat generation in the device and saving power consumption. In addition, the partition wall may have an elliptical section to achieve the similar effects.

What is claimed is:

1. A transferring apparatus comprising:
    a tubular partition wall member having a reduced thickness portion formed in the partition wall member;
    a floating carrier member having a feeding rod and being disposed around an outer periphery of the partition wall member;
    a target member disposed on the floating carrier member in opposed relation to the reduced thickness portion of the partition wall member;
    an actuating block disposed inside the tubular partition wall member and being mounted movably between opposite ends of the tubular partition wall member in bidirections; and
    a magnetic bearing unit mounted integrally on an outer face of the actuating block for supporting the floating carrier member through the partition wall member, the magnetic bearing unit having a set of a sensor and an electromagnet disposed in opposed relation to the reduced thickness portion of the tubular partition wall member.

2. The transferring apparatus in accordance with claim 1, wherein the tubular partition wall member has a circular cross section.

3. The transferring apparatus in accordance with claim 1, wherein the tublar partition wall member has an ellipical cross section.

4. The transferring apparatus in accordance with claim 1, wherein the floating carrier member is a non magnetic material, and the target member is a magnetic material.

5. The transferring apparatus in accordance with claim 1, wherein an inside of the tubular partition wall member is held under atmospheric state, and an outside of the tubular partition wall member is exposed to vacuum state in a vaccum chamber.

6. The transferring apparatus in accordance with claim 1, wherein in each set of sensor and electromagnet, the sensor senses a gap between the electromagnet and the floating carrier member through the reduced thickness portion of the tubular partition wall member and controls the excitation of the electromagnet in accordance with the sensed value.

7. The transferring apparatus in accordance with claim 1, including a linear drive unit for driving the actuating block between opposite ends of the tubular partition wall member, the linear drive unit comprising a linear movable member disposed on the actuating block, and a linear stationary member coupled to the linear movable member.

8. An apparatus comprising: a tubular member having a peripheral wall having a reduced thickness portion; a movable carrier member at least partly encircling the tubular member and movable along the tubular member; first magnetic means disposed within the tubular member coacting with second magnetic means carried by the carrier member for magnetically floating the carrier member on the tubular member, the first and second magnetic means being disposed on opposite sides of the tubular member peripheral wall in opposed relation to one another through the peripheral wall reduced thickness portion; and actuating means for displacing the carrier member along the tubular member while the carrier member is magnetically afloat on the tubular member.

9. An apparatus according to claim 8; wherein the second magnetic means comprises magnetic pieces extending along the carrier member, and the first magnetic means comprises electromagnets coacting with the magnetic pieces through the reduced thickness portion of the peripheral wall to create magnetic forces effective to maintain the carrier member magnetically afloat on the tubular member.

10. An apparatus according to claim 9; wherein the magnetic pieces extend lengthwise along the carrier member.

11. An apparatus according to claim 9; wherein the electromagnets are arranged in pairs along two orthogonal axes.

12. An apparatus according to claim 9; wherein the first magnetic means includes sensing means for sensing the distance between the electromagnets and the tubular member peripheral wall.

13. An apparatus according to claim 12; wherein the sensing means comprises a plurality of sensors each disposed adjacent one of the electromagnets in the region of the reduced thickness portion of the peripheral wall.

14. An apparatus according to claim 8; wherein the carrier member is composed of non-magnetic material.

15. An apparatus according to claim 8; wherein the tubular member has a non-rectangular cross section.

16. An apparatus according to claim 15; wherein the tubular member has a circular cross-section.

17. An apparatus according to claim 8; wherein the tubular member comprises an airtight member.

18. An apparatus according to claim 8; wherein the actuating means comprises means for reciprocally displacing the carrier member lengthwise of the tubular member to effect corresponding displacement of the carrier member while the same is magnetically afloat on the tubular member.

19. An apparatus according to claim 18; wherein the actuating means comprises a linear motor.

20. An apparatus according to claim 18; wherein the second magnetic means comprises magnetic pieces extending along the carrier member, and the first magnetic means comprises electromagnets coacting with the magnetic pieces through the reduced thickness portion of the peripheral wall to create magnetic forces effective to maintain the carrier member magnetically afloat on the tubular member.

* * * * *